US006821892B1

(12) United States Patent
Peng et al.

(10) Patent No.: US 6,821,892 B1
(45) Date of Patent: Nov. 23, 2004

(54) INTELLIGENT WET ETCHING TOOL AS A FUNCTION OF CHEMICAL CONCENTRATION, TEMPERATURE AND FILM LOSS

(75) Inventors: Chun Hong Peng, Hsinchu (TW); Rex Chen, Hsinchu (TW); Simon Chang, Hsinchu (TW)

(73) Assignee: Promos Technologies, Inc., Hsin-Chu (TW)

( * ) Notice: Subject to any disclaimer, the term of this patent is extended or adjusted under 35 U.S.C. 154(b) by 669 days.

(21) Appl. No.: 09/919,036

(22) Filed: Jun. 4, 2001

(51) Int. Cl.$^7$ ............................................. H01L 21/302
(52) U.S. Cl. ...................... 438/689; 438/745; 438/748; 438/749; 438/750; 438/751
(58) Field of Search ................................ 438/689, 705, 438/706, 735, 738, 748, 704, 745, 749–751

(56) References Cited

U.S. PATENT DOCUMENTS

| 5,582,746 A | 12/1996 | Barbee et al. ................. 216/86 |
| 6,004,881 A | 12/1999 | Bozada et al. ............... 438/705 |
| 6,383,333 B1 * | 5/2002 | Haino et al. .............. 156/345.1 |

FOREIGN PATENT DOCUMENTS

| EP | 618612 A2 * | 10/1994 | ......... H01L/21/306 |
| WO | WO 01/28950 A1 * | 4/2001 | ........... C03C/23/00 |

* cited by examiner

*Primary Examiner*—Thanh Nguyen
(74) *Attorney, Agent, or Firm*—George O. Saile; Stephen B. Ackerman; Stephen G. Stanton

(57) ABSTRACT

A method is disclosed for accurately predicting the wet etch end points as a function of the temperature and concentration of the etching solution, as well as of the thickness of the film to be etched. This is accomplished by fitting an etch rate equation to the process of etching a film in terms of two constant parameters that are determined by one set of experiments performed on a given wet etch bench. Thereafter, the constants are used with the rate equation to calculate precisely the etch rate of a film, and then the etch rate is divided into a target film loss or a target film thickness to obtain etching time, or time to etch, which takes into account the variations in temperature and concentration, for example, of the acid in the solution. The resulting film either looses the specified amount of material, or acquires the specified thickness without incurring any damage, which is especially suited for sub-micron semiconductor technology where precise etching is required.

12 Claims, 3 Drawing Sheets

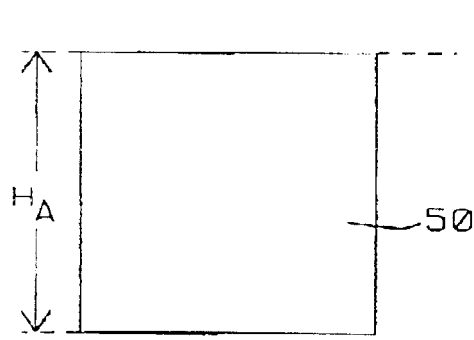
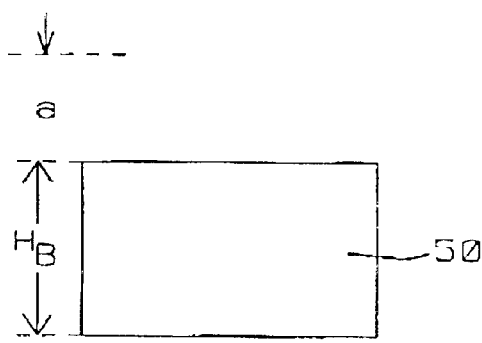
FIG. 1a    FIG. 1b
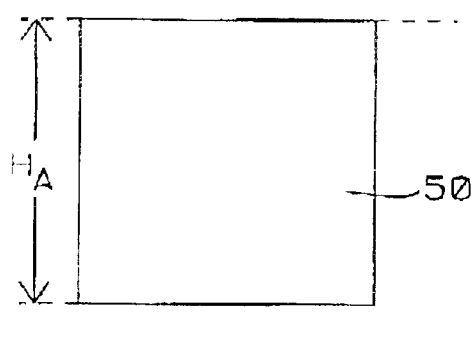
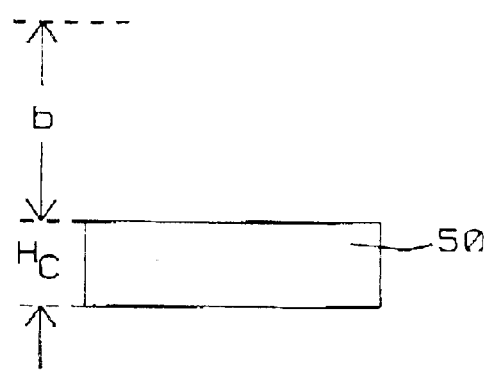
FIG. 2a    FIG. 2b

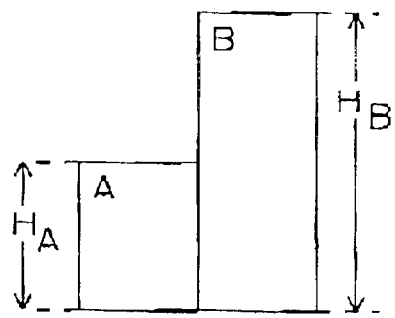
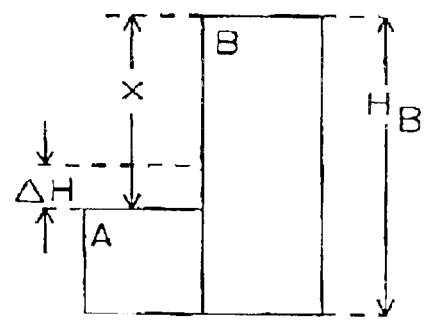
FIG. 3a              FIG. 3b
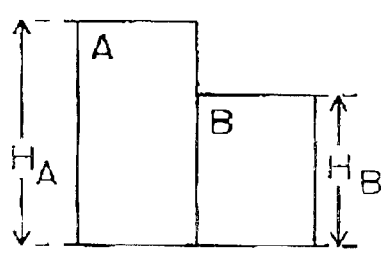
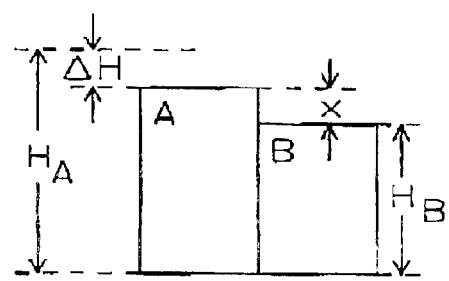
FIG. 4a              FIG. 4b
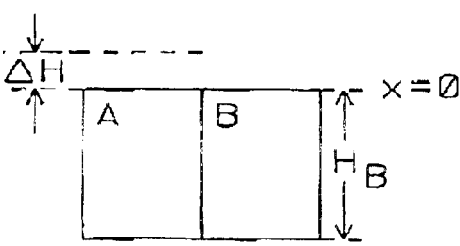
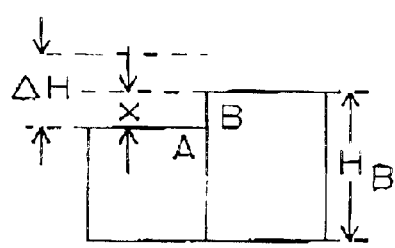
FIG. 4c              FIG. 4d

INTELLIGENT WET ETCHING TOOL AS A FUNCTION OF CHEMICAL CONCENTRATION, TEMPERATURE AND FILM LOSS

BACKGROUND OF THE INVENTION (1) Field of the Invention

The present invention relates to the manufacture of integrated circuits in general, and in particular, to a functional tool for determining the etch rates and time to etch as a function of chemical properties as well as the thickness of the material that is being etched to form integrated circuits.

(2) Description of the Related Art

It is usually the common practice that in order to remove a given amount of material by etching, the material is subjected to a corresponding time of etching. That is, for a set "film loss target", such as in terms of the film thickness, a "time to etch" is calculated knowing the etch rate for that particular etching process. Then, the same calculated etch time is used from run-to-run. However, it will be appreciated by those skilled in the art that the etch rate, and hence the etch time will vary from run-to-run, even for the same material that is being etched with the same etch recipe, because conditions that affect etching, such as temperature, concentration, and other factors will vary from run-to-run. With the same etch time, therefore, films may be over etched, or, damaged. Hence, it is the purpose of the present invention to provide a method of calculating variable etch rates as a function of the conditions of the etching process, as well as the variable thickness of the material that is being etched, as disclosed later in the embodiments of the invention.

In prior art, various characterizations of wet etch are shown. In U.S. Pat. No. 6,004,881, Bozada, et al., disclose a wet chemical digital etching technique for gallium arsenide or other semiconductor materials. Hydrogen peroxide and an acid are used in a two step etching cycle to remove the gallium arsenide. In the first step of the cycle, gallium arsenide is oxidized by 30% hydrogen peroxide to form an oxide layer that is diffusion limited to a certain thickness. The second step of the cycle removes this oxide layer with an acid that does not attack unoxidized gallium arsenide. These steps are repeated in succession using new reactant materials and cleaning after each reactant until the desired etch depth is obtained. A method for using a Hall effect measurement to determine the achieved change in surface layer thickness of doped semiconductor material is also taught.

In another U.S. Pat. No. 5,582,746, Barbee, et al., teach a contactless method and apparatus for real-time in-situ monitoring of a chemical etching process during etching of at least one wafer in a wet chemical etchant bath. The method comprises the steps of providing two conductive electrodes in the wet chemical bath, wherein the two electrodes are proximate to but not in contact with a wafer; monitoring an electrical characteristic between the two electrodes as a function of time in the etchant bath of the at least one wafer, wherein a prescribed change in the electrical characteristic is indicative of a prescribed condition of the etching process; and recording a plurality of values of the electrical characteristic as a function of time during etching. From the plurality of recorded values and corresponding times, instantaneous etch rates, average etch rates, and etching end points are determined.

What is needed, however, is a method of determining etch end points where the conditions of the bath, such as the temperature and the concentration of the etching solution, as well as the properties of the film that is being etched are also taken into account. Such a method is disclosed later in the embodiments of the present invention.

SUMMARY OF THE INVENTION

It is therefore an object of the present invention to provide a method of determining wet etch points.

It is another object of the present invention to provide a method of determining etch rate as a function of bath temperature and solution concentration.

It is yet another object of the present invention to provide a method of determining etching time, or time to etch, as a function of bath temperature, solution concentration and the thickness of the film to be etched.

It is still another object of the present invention to provide a method of determining wet etch points for a target film loss or for a target film thickness.

These objects are accomplished by providing a rate formula $ER(C, T)=ER_0*C*\exp(-E_a/RT)+A$; providing a substrate; providing an etch bath in a tank; providing an etch concentration monitor in said tank; providing a temperature monitor in said tank; forming a film over said substrate; measuring the initial thickness of said film over said substrate; placing said film on said substrate in said tank; starting the etching of said film in said tanks, and simultaneously recording the start time of said etching; measuring a first temperature of said etch bath in said tank; measuring a first concentration of said etch bath in said tank; stopping said etching of said film, and recording the stop time of said etching; removing said substrate with said film thereon from said tank; measuring the final thickness of said film on said substrate; calculating a first film loss by subtracting said initial thickness from said final thickness of said film; calculating a first etch time by subtracting said start time from said stop time of etching; calculating a first etch rate $(ER(T,C)_1)$ as a function of said first temperature and first concentration; repeating previous steps at second, third, (n-1) and n temperatures while holding constant said first concentration, and calculating the corresponding second, third, (n-1) and $n^{th}$ etch rates $[ER(T)_{C2}, \ldots ER(T)_{C(n-1)}, ER(T)_{Cn}]$ values as a function of said temperatures, and their statistical average $(ER(T)_{C,avg.})$; repeating previous steps at second, third, (n-1) and n concentration while holding constant said first temperature, and calculating the corresponding second, third, (n-1) and $n^{th}$ etch rates $[ER(C)_{T2}, \ldots ER(C)_{T(n-1)}, ER(C)_{Tn}]$ values as a function of said concentrations, and their statistical average $(ER(C)_{T,avg.})$; using said values in said formula to calculate etch rate ER for subsequent etching of said film for a specified film loss or to a specified film thickness; providing a substrate having formed thereon a first film to be etched and a second film, wherein a first film thickness o said first film is less than a second film thickness of said second film; calculating a film loss $\Delta H$ for said specified film loss or for said specified film thickness; and calculating etch time.

These objects are further accomplished by providing a rate formula $ER(C,T)=ER_0*C*\exp(-E_a/RT)+A$; rewriting said formula in a simplified form as $ER(C)=K*C+A$; determining the values of first constant K and second constant A in said formula for sand etching solution; using said values of said first and second constants in said simplified equation to calculate an etch rate; providing a substrate having formed thereon a first film A to be etched and a second film B, wherein a first film thickness of said first film A is $H_A$, and a second film thickness of said second film B is $H_B$; calculating a film loss $\Delta H$; and calculating etch time.

BRIEF DESCRIPTION OF THE DRAWINGS

FIG. 1a is a cross-sectional view of a film of a given thickness prior to etching, according to the present invention.

FIG. 1b is a cross-sectional view of the film of FIG. 2a after having lost during etching a specified amount of its own material, according to the present invention.

FIG. 2a is a cross-sectional view of another film of a given thickness prior to etching, according to the present invention.

FIG. 2b is a cross-sectional view of the film of FIG. 2a after having been etched to a specified thickness, according to the present invention.

FIG. 3a is a cross-sectional view of a first film and a second film where the thickness of the first film is larger than that of the first one, according to the present invention.

FIG. 3b is a cross-sectional view of the films of FIG. 3a after having been etched to a specified thickness, according to the present invention.

FIG. 4a is a cross-sectional view of a first film and a second film where the thickness of the first film is smaller than that of the first one, according to the present invention.

FIG. 4b is a cross-sectional view of the films of FIG. 4a after having been etched to a specified thickness, having as film loss of $\Delta H=(H_A-H_B)-x$, according to the present invention.

FIG. 4c is a cross-sectional view of the films of FIG. 4a after having been etched to a specified thickness, having as film loss of $\Delta H=(H_A-H_B)$, according to the present invention.

FIG. 4d is a cross-sectional view of the films of FIG. 4a after having been etched to a specified thickness, having as film loss of $\Delta H=(H_A-H_B)+x$, according to the present invention.

DESCRIPTION OF THE PREFERRED EMBODIMENTS

Figure 5A:
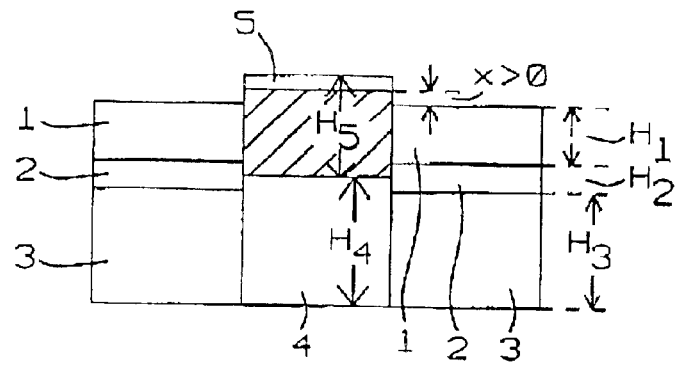
FIG. 5a is a cross-sectional view of five different films of five different thicknesses where one film is etched to protrude a certain amount above the level of the other two adjacent films, according to the present invention.

In addition to the considerations of isotropic or anisotropic etching in general, it is important to consider simply the amount of material that is removed vertically during etching. That is to say, irrespective of the shape of the resulting feature, the amount of material that is removed can become critical in order to avoid damage to the film that is being etched. It will be appreciated by those skilled in the at that this gains additional importance in sub-micron semiconductor technology.

Thus, referring to the drawings, FIGS. 1a and 1b show a film of a certain material (50) having a thickness of ($H_A$) formed on a substrate not shown. It is specified that the thickness of the film be reduced by an amount of (a) as shown in FIG. 1b. In other words, the specified film loss target thickness is (a). In order to remove the specified amount of material, the substrate and the film is placed in an etching bath in an etch tank, and etched for a period of time, (t), based on an etch rate commensurate with the particular film and the particular etch recipe that is used. It will be noted that although the resulting thickness can now be calculated to be $(H_A-a)=H_B$, it is the film loss target (a) that is specified, notwithstanding the final thickness of the film. Hence, several batches of the product can be run with the same etch time to attain the desired film loss. If, on the other hand, a final thickness ($H_C$) is specified, then the etching can continue until the desired film thickness is obtained, irrespective of the amount of film loss. As is currently practiced in the present manufacturing line, a target "b" shown in FIG. 2b is calculated and the film subjected to an appropriate etch time commensurate with the particular etch rate.

However, it will be appreciated that in a manufacturing line, the initial film thickness $H_A$ can vary from substrate, or, wafer to wafer. More importantly, because of the varying conditions in the etch bath itself, such as the concentration of acid, for example, the etch rate will vary. One reason for the change is the continual addition of the material being etched into the bath during the etching process itself, in addition to the possibly varying etch recipes from one run to another. An etch solution can be hydrogen fluoride (HF), for example. Other variables that can change from one batch to another can be the temperature of the bath, or the etching solution. This can be seen in the equation that is currently used in the present manufacturing line for calculating the etch rate, ER, which is a function of both the solution concentration and the temperature, namely, $$ER(C,T)=ER_0*C*\exp(-E_a/RT)+A \qquad (1)$$

where $ER_0$ is a constant for a particular etch
C is the etching solution concentration
T is the solution temperature
$E_a$ is the etching activation energy
R is gas constant
A is another constant parameter The universal gas constant, R, has the value of 8.314 Joules/Kelvin (J/K), as is known in the field, and the activation energy $E_a$ depends upon the chemical characteristics of the solution.

It is a main feature and key aspect of the present invention that the rate equation (1) can be tailored, or arranged, with the methods disclosed here, to be used to predict accurately the etch rate of a film as a function of both the temperature and the concentration of a particular etching solution bath. This is accomplished by conducting etching experiments in an etching equipment with a film on a substrate and measuring the etch rate of the film as a function of the etch solution concentration while holding the bath temperature constant. Then an etch rate measurement is repeated as a function of varying temperature while normalizing the bath concentration with continual measurement of the concentration. The variable etch rate as a function of temperature only can be represented by $ER(T)_C$ while the etch rate as a function of concentration while holding temperature constant, represented by $ER(C)_T$.

To determine the various constants in Eq. 1, experiments are conducted. First, a film, such as for example, the well-known $SiO_2$ or TEOS, is formed over a substrate, and its initial thickness is measured and recorded as ($H_A$). The film is then placed in a wet etch bath in a tank. The tank is provided with appropriate instrumentation to monitor continually the temperature (with a thermocouple, for example) of the bath and the concentration (with an in-line monitor) of the etching solution in the bath. The etching is started and a first temperature and a first concentration of the solution are measured and recorded. After the first etch is completed, the etching time is recorded, the thickness of the film re-measured, and from the difference in the film thickness and the etch time, an etch rate $ER(T,C)_1$, normally in units of angstroms (Å)/minute, is calculated by dividing the former by the latter. Similar measurements are repeated at second, third, (n−1) and n temperatures while holding constant said first concentration, and calculating the corresponding second, third, (n−1) and $n^{th}$ etch rates $[ER(T)_{C2}, \ldots ER(T)_{C(n-1)}, ER(T)_{Cn}]$ values as a function of said temperatures. Subsequently, a statistical average $(ER(T)_{C,avg.})$ of the etch rate is obtained for varying temperatures while holding concentration constant.

A second set of experiments are next conducted at second, third, (n−1) and n concentrations while holding constant the first temperature, and calculating the corresponding second, third, (n−1) and $n^{th}$ etch rates $[ER(C)_{T2}, \ldots ER(C)_{T(n-1)}, ER(C)_{Tn}]$ values as a function of the measured concentrations, and their statistical average $(ER(C)_{T, avg.})$.

Then, with the experimental values so obtained, and noting that Eq.1 can be simplified considerably by assuming that the bath temperature remains constant, e.g., between about 0.1 to 0.3° C. in a STEAG etch bench used in the present manufacturing line, Eq. 1 becomes:

$$ER(C)=63.5328*C-5.1649 \qquad (2)$$

In other words, Eq. 1 takes the form $$ER(C)=K*C+A,$$

where, in a STEAG wet bench, the first constant parameter K takes the value of 63.5328 and the second constant parameter A takes the value of −5.1649.

Hence, equation (2) is more than acceptably accurate under these conditions. However, it will be apparent to those skilled in the art that the non-simplified equation (1) may also be used to calculate the etch rate with the same values of the constant parameters.

Thus, knowing the etch rate from equation (2) for a particular concentration of the etching solution, it is now possible to calculate immediately the time to etch for either a constant film loss irrespective of the remaining thickness of the film as in FIGS. 1a and 1b, or a constant target film thickness, such as $H_C$ shown in FIGS. 2a and 2b, irrespective of the film loss. The etch time, t, can easily be calculated from equation:

$$t=\Delta H/ER(C,T) \qquad (3)$$

where $\Delta H=(H_A-H_B)$=constant as shown in FIG. 2, or, $\Delta H=(H_A-H_C)$=variable as shown in FIG. 3.

In general, values of $\Delta H$ can be determined by system requirements, which is the most straight forward case. Or, if the system defines the final film thickness, then the film loss $\Delta H$ is simply the difference between the present thickness and the final thickness. If the required etched step height "x" is defined, then the film loss $\Delta H$ can be determined as shown in FIGS. 3a–3b and 4a–5d as follows:

In FIG. 3a, two film thickness A and B are shown, where film thickness $H_A$ is less then film thickness $H_B$ and film A is to be etched as shown in FIG. 3b. Then the film loss for a given step "x" is $$\Delta H=x-(H_B-H_A)$$

In FIGS. 4a–4d, film thickness $H_a>H_b$, then $\Delta H=(H_A-H_B)-x$ for the case shown in FIG. 4b.

In FIG. 4c, where step height x=0, $\Delta H=(H_A-H_B)$ for the case shown in FIG. 4b.

Finally, In FIG. 4d, $\Delta H=(H_A-H_B)+x$

Figure 5B:
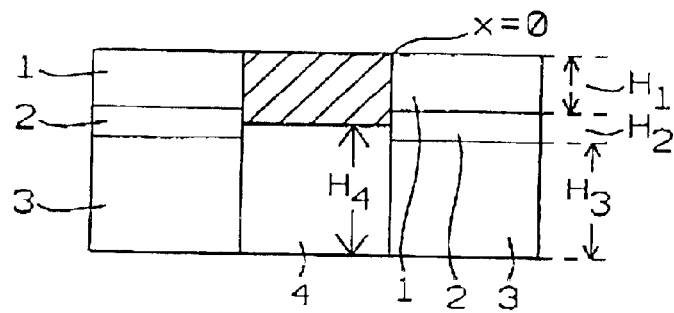
FIG. 5b is a cross-sectional view of the five films of FIG. 5a where the protruding film is leveled with respect to the other two adjacent films, according to the present invention.
Figure 5C:
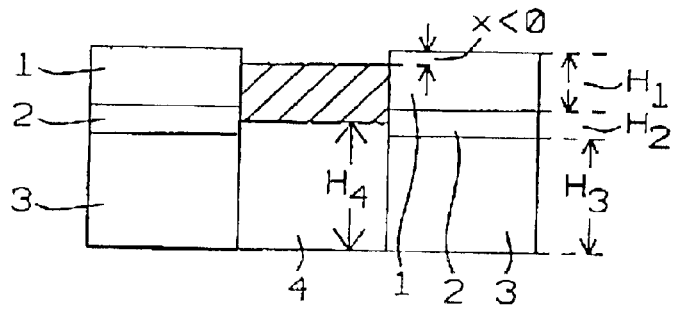
FIG. 5c is a cross-sectional view of the five films of FIG. 5a where the protruding film is etched to have a recess with respect to the other two adjacent films, according to the present invention.
Figure 5D:
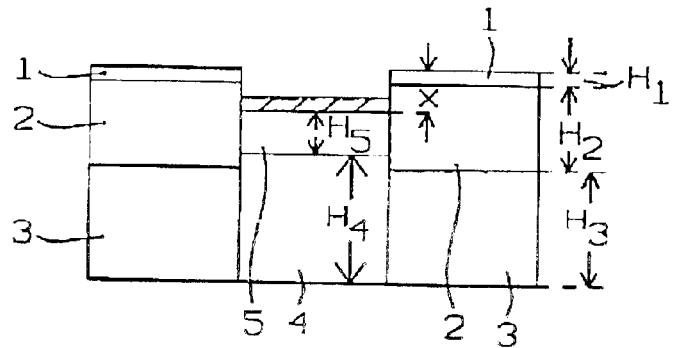
FIG. 5d is a cross-sectional view of the five films of FIG. 5a where the film loss $\Delta H=x-[(H_1+H_2+H_3)-(H_4+H_5)]$, according to the present invention.

Equation (3) can also be used to advantage in controlling, what is called, the film leveling concerns. film leveling is especially important in photolithography as the surface over which the lithography will be performed must be level to rigid specifications, for otherwise, photo defocus issue comes into play, which in turn can cause open or shorting of metal films. FIGS. 5a–5d show five different films 1 through 5, each having its own corresponding thickness $H_1, \ldots H_5$. Depending upon a particular process step, it may be desired to have film (5) level with respect to the surrounding film (1), or higher or lower by a certain amount (x). In other words, defining $$\Delta H=(H_4+H_5)-(H_1+H_2+H_3)-x \qquad (4)$$

the etch times for the three conditions, namely, $x>0$, $x=0$ and $x<0$ as shown in FIGS. 5a, 5b and 5c, respectively, can be calculated by first calculating the respective $\Delta H_5$s as shown above and then using that value in Eq. (3) along with the already calculated etch rate, ER, that pertains to that particular film and etch. However, if the stack height of $H_4$ and $H_5$ shown in FIG. 5d is lower than $H_1+H_2+H_3$ before etch, then $$\Delta H=x-[(H_1+H_2+H_3)-(H_4+H_5)],$$

where "x" is the desired step height and has a positive value.

It is important to note that the two sets of experiments conducted to determine the etching parameters K and A for Eq. 1 or 2 are performed only once for the particular wet etch bench. Thereafter, either equation may be used to calculate the etch rate as a function of the temperature and/or concentration of the etching solution, which in turn can be used to calculate the "time to etch" for a specified amount of film loss or for a specified target film thickness. Though these numerous details of the disclosed method are set forth here—such as the process of obtaining parameters K and A for etching a particular film with a corresponding etch recipe—to provide an understanding of the present invention, it will be obvious, however, to those skilled in the art that these specific details need not be employed to practice the present invention. At the same time, it will be evident that the same methods may be employed in other similar process steps that are too many to cite, for example, in obtaining values for the parameters $ER_C$ and A for the non-simplified version of equation (1).

That is to say, while the invention has been particularly shown and described with reference to the preferred embodiments thereof, it will be understood by those skilled in the art that various changes in form and details may be made without departing from the spirit and scope of the invention.

What is claimed is:

1. A method of determining the etch rate and time to etch as a function of the properties of the etching process and of the film being etched, comprising the steps of:

providing a rate formula $ER(C,T)=ER_0*C*\exp(-E_a/RT)+A$;

providing a substrate;

providing an etch bath in a tank;

providing an etch concentration monitor in said tank;

providing a temperature monitor in said tank;

forming a film over said substrate;

measuring the initial thickness of said film over said substrate;

placing said film on said substrate in said tank;

starting the etching of said film in said tank, and simultaneously recording the start time of said etching;

measuring a first temperature of said etch bath in said tank;

measuring a first concentration of said etch bath in said tank;

stopping said etching of said film, and recording the stop time of said etching;

removing said substrate with said film thereon from said tank;

measuring the final thickness of said film on said substrate;

calculating a first film loss by subtracting said initial thickness from said final thickness of said film;

calculating a first etch time by subtracting said start time from said stop time of etching;

calculating a first etch rate $(ER(T,C)_1)$ as a function of said first temperature and first concentration;

repeating previous steps at second, third, (n-1) and n temperatures while holding constant said first concentration, and calculating the corresponding second, third, (n-1) and $n^{th}$ etch rates $[ER(T)_{C2}, \ldots ER(T)_{C(n-1)}, ER(T)_{Cn}]$ values as a function of said temperatures, and their statistical average $(ER(T)_{C,avg.})$;

repeating previous steps at second, third, (n-1) and n concentration while holding constant said first temperature, and calculating the corresponding second, third, (n-1) and $n^{th}$ etch rates $[ER(C)_{T2}, \ldots ER(C)_{T(n-1)}, ER(C)_{Tn}]$ values as a function of said concentrations, and their statistical average $(ER(C)_{T,avg.})$;

using said values in said formula to calculate etch rate ER for subsequent etching of said film for a specified film loss or to a specified film thickness;

providing a substrate having formed thereon a first film to be etched and a second film, wherein a first film thickness of said first film is less than a second film thickness of said second film;

calculating a film loss $\Delta H$ for said specified film loss or for said specified film thickness; and calculating etch time;

wherein T is temperature, C is concentration, ER(C, T) is etch rate as a function of concentration (C) and temperature (T), $ER_0$ is a first constant, $E_a$ is activation energy; R is the universal gas constant, A is a second constant and $\Delta H$ is film loss.

2. The method of claim 1, wherein said initial film thickness is designated as $H_A$ and said final film thickness is designated as $H_B$.

3. The method of claim 1, wherein said initial film thickness is designated as $H_A$ and said final film thickness is designated as $H_B$; and said film loss is $\Delta H=(H_A-H_B)$.

4. The method of claim 1, wherein said etch time (t) is calculated using the formula $t=\Delta H/ER$.

5. A method of determining the etch rate and time to etch as a function of the properties of the etching process and of the film being etched, comprising the steps of:

providing a rate formula $ER(C,T)=E_0*C*\exp(-E_a/RT)+A$;

rewriting said formula in a simplified form as $ER(C)=K*C+A$;

determining the values of first constant K and second constant A in said formula for said etching solution;

using said values of said first and second constants in said simplified equation to calculate an etch rate;

providing a target film loss or a target film thickness; and calculating etching time, or "time to etch;"

wherein T is temperature, C is concentration, ER(C, T) is etch rate as a function of concentration (C) and temperature (T), $E_a$ is activation energy; R is the universal gas constant, A is a first constant, K is a second constant $ER_0$ is a third constant and $\Delta H$ is film loss.

6. The method of claim 5, wherein said etching time is obtained by dividing said target film loss by said etch rate.

7. A method of determining the etch rate and time to etch as a function of the properties of the etching process and of the film being etched, comprising the steps of:

providing a rate formula $ER(C, T)=ER_0*C*\exp(-E_a/RT)+D$;

rewriting said formula in a simplified form as $ER(C)=K*C+D$;

determining the values of first constant K and second constant D in said formula for said etching solution;

using said values of said first and second constants in said simplified equation to calculate an etch rate;

providing a substrate having formed thereon a first film A to be etched and a second film B, wherein a first film thickness of said first film A is $H_A$, and a second film thickness of said second film B is $H_B$;

calculating a film loss $\Delta H$; and calculating etch time;

wherein T is temperature, C is concentration, ER(C, T) is etch rate as a function of concentration (C) and temperature (T), $E_a$ is activation energy; R is the universal gas constant, D is a first constant, K is a second constant, $ER_0$ is a third constant and $\Delta H$ is film loss.

8. The method of claim 7, wherein said film loss $\Delta H$ is $x-(H_B-H_A)$, wherein said $H_B$ is greater than said $H_A$, and x is the desired depth height of said film A above said film B after etch.

9. The method of claim 7, wherein said film loss is $\Delta H=(H_A-H_B)-x$, wherein said $H_A$ is greater than said $H_B$, and x is the desired depth height of said film A above said film B after etch.

10. The method of claim 7, wherein said film loss is $\Delta H=(H_A-H_B)$, wherein before etch, said $H_A$ is greater than said $H_B$, and after etch, they are of the same height.

11. The method of claim 7, wherein said film loss is $\Delta H=(H_A-H_B)+x$, wherein before etch, said $H_A$ is greater than said $H_B$, and after etch, said film B is higher than said film A by the step height of x.

12. The method of claim 7, wherein said etch time (t) is calculated using the formula $t=\Delta H/ER$.

* * * * *